United States Patent
Hansen

(10) Patent No.: US 7,567,699 B2
(45) Date of Patent: Jul. 28, 2009

(54) CENTER DETERMINATION OF ROTATIONALLY SYMMETRICAL ALIGNMENT MARKS

(75) Inventor: Sven Hansen, Kiefersfelden (DE)

(73) Assignee: Sus MicroTec Lithography GmbH, Garching (DE)

( * ) Notice: Subject to any disclaimer, the term of this patent is extended or adjusted under 35 U.S.C. 154(b) by 904 days.

(21) Appl. No.: 11/176,961

(22) Filed: Jul. 7, 2005

(65) Prior Publication Data

US 2007/0008532 A1 Jan. 11, 2007

(30) Foreign Application Priority Data

Jul. 7, 2004 (DE) .................... 10 2004 032 933

(51) Int. Cl.
G06K 9/00 (2006.01)
G06K 9/36 (2006.01)
G01B 11/02 (2006.01)

(52) U.S. Cl. ............ 382/144; 382/287; 382/288; 356/509

(58) Field of Classification Search ......... 382/100, 382/141–152, 190, 287, 288, 296; 257/797; 356/508–510; 438/401

See application file for complete search history.

(56) References Cited

U.S. PATENT DOCUMENTS

| | | | | |
|---|---|---|---|---|
| 5,086,477 A | | 2/1992 | Yu et al. | 382/8 |
| 5,982,044 A | * | 11/1999 | Lin et al. | 257/797 |
| 6,600,561 B2 | * | 7/2003 | Tabei | 356/401 |
| 6,628,406 B1 | * | 9/2003 | Kreuzer | 356/508 |
| 6,682,863 B2 | * | 1/2004 | Rivers et al. | 430/22 |
| 2004/0033426 A1 | * | 2/2004 | Den Boef et al. | 430/22 |
| 2004/0048173 A1 | * | 3/2004 | Tutt et al. | 430/22 |
| 2005/0016818 A1 | * | 1/2005 | Ito et al. | 198/345.1 |
| 2005/0246915 A1 | * | 11/2005 | Lu et al. | 33/645 |

FOREIGN PATENT DOCUMENTS

DE 25 36 263 A1 3/1976

OTHER PUBLICATIONS

Nishihara et al. ("Measuring photolithographic overlay accuracy and critical dimensions by correlating binarized Laplacian of Gaussian Convolutions", IEEE Trans. Pattern Analysis and Machine Intelligence, vol. 10, No. 1, Jan. 1988, pp. 17-30).*
Aghajan et al. ("Low complexity subspace-based estimation of axis of symmetry for lithographic alignment", SPIE vol. 2196 (1994), pp. 500-511).*
Lin et al. ("Detection of rotationally symmetric shape orientation by fold-invariant shape-specific points", Pattern Recognition, vol. 25, No. 5, (1992), pp. 473-482.*

* cited by examiner

*Primary Examiner*—Yubin Hung
(74) *Attorney, Agent, or Firm*—Perman & Green, LLP

(57) ABSTRACT

The invention provides a method for determining the center of a rotationally symmetrical alignment mark thereby using an image recognition software. The alignment mark is recognized by the image recognition software in different orientations by rotating the alignment mark around a symmetry angle with respect to which the alignment mark is rotationally symmetrical, and respective reference points are determined. The center of rotation of the determined reference points corresponds to the center of the alignment mark. Moreover, the invention provides a method for aligning two flat substrates each having a rotationally symmetrical alignment mark and being arranged substantially parallel with respect to each other. To this end, the centers of the alignment marks of the two substrates are determined by means of the method for determining the centers according to the present invention, and the two substrates are aligned by moving at least one of the two substrates in parallel so that the positions of the centers of the alignment marks coincide.

22 Claims, 2 Drawing Sheets

CENTER DETERMINATION OF ROTATIONALLY SYMMETRICAL ALIGNMENT MARKS

CROSS-REFERENCE TO RELATED APPLICATIONS

Figure 1:
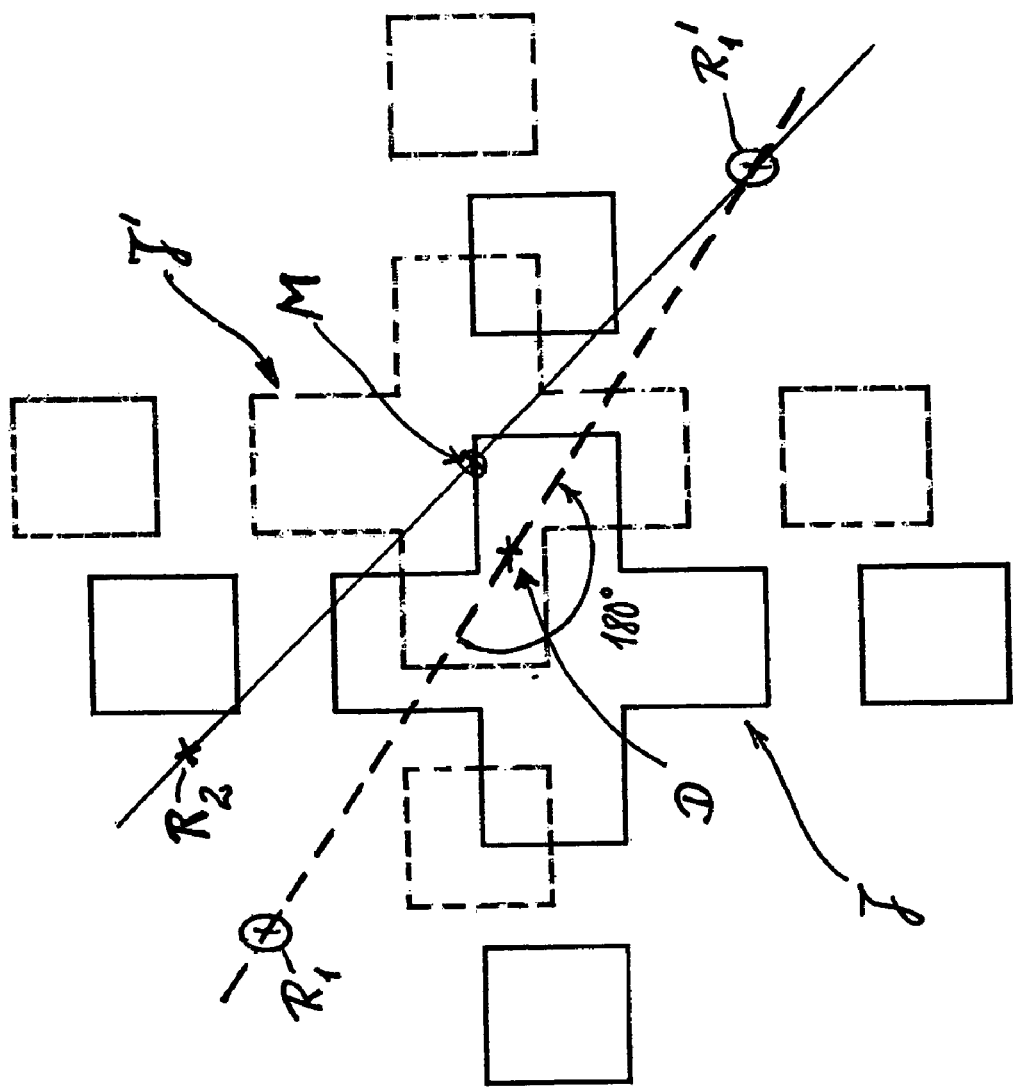

This application claims priority from Germany Patent Application No. 10 2004 032 933.8-52, filed on Jul. 7, 2004.

The invention relates to a method for determining the center or central point of rotationally symmetrical alignment marks and the use of this method for aligning two substrates, in particular a mask with respect to a wafer in a mask aligner.

Before exposing a substrate through a mask during the manufacture of semiconductor components, the mask must first be positioned with respect to the substrate. This is normally done in a mask positioning means or mask aligner. Both the mask and the substrate have alignment marks by means of which the mask can be aligned with respect to the substrate. During the adjustment process, the alignment marks are monitored by means of an alignment microscope. The mask and the substrate are aligned as soon as the two alignment marks overlap.

In order to be able to simultaneously monitor the two alignment marks also in the aligned state of mask and waver, for example one of the two alignment marks might be larger than the other one. This means that if the alignment arrangement is configured such that the mask is arranged between the alignment microscope and the wafer, the alignment mark of the wafer is larger than that of the mask. The alignment mark on the mask and the alignment mark on the wafer can also have different geometries, i.e. for example complementary geometries on the mask and wafer. It is only important that the edges of the structure of the one alignment mark are not covered by the edges of the structure of the other alignment mark.

In a modern mask aligner, an image recognition system comprising an image recognition software is used for aligning the mask with respect to the substrate. This software can recognize learned images in a highly precise manner and determine their position. The software is first trained such that the image of the alignment mark is recognized on the wafer or the mask. This requires two independent training sequences since—as described above—the two alignment marks can have different sizes. For training, an area around the alignment mark is determined. The image within this area can be recognized by the software. For defining the position of the alignment marks, a reference point, which is called "origin" (in the following: ORIGIN), is determined within the defined area. The position of the recognized image is output on the basis of coordinates and with reference to the ORIGIN of the trained image. Since the alignment marks of mask and wafer must be trained independently of one another, the respective reference points are also set independently of one another.

For aligning a wafer with respect to a mask, the alignment mark on the mask is recognized by means of the trained image recognition software. The position of the mask alignment mark is represented by the coordinates of the ORIGIN of the mask alignment mark. Then, the optionally larger or differently shaped (e.g. complementary) alignment mark on the wafer is recognized on the basis of the image trained in the independent training process, and then its position is represented by means of the ORIGIN of the wafer alignment mark. Wafer and mask are then aligned in such a manner with respect to each other that the positions of the respective reference points are identical. In general, at least two alignment marks on each of the mask and wafer must be made to coincide simultaneously, i.e. their ORIGIN points must correspond to each other after alignment. However, if mask and wafer have different dimensions, which might be caused, e.g., by thermal expansion, it might be the case that mask and wafer cannot be aligned in such a manner that the positions of all respective ORIGIN points on the mask and wafer are identical. In such a case, positioning is performed in accordance with the smallest error square.

Since the ORIGIN points of the alignment marks of mask and wafer, which are defined manually by the user in two different training steps, define the position of the recognized image, it is important that these ORIGIN points for both the alignment mark of the mask and the alignment mark of the wafer lie on equivalent positions with respect to the alignment marks. It thus suggests itself to define the ORIGIN points as close as possible to the center of the alignment mark, which is typically formed as an alignment cross. However, the manual-definition of the ORIGIN points can cause errors in the definition thereof and thus errors in the alignment. Such an error can be corrected later by means of a so-called "offset". For this purpose, the exposure result on the exposed wafers is tested, and the deviation to be corrected is determined on the basis thereof. However, this can only be done later, i.e. by causing further costs, and also only to a limited extent.

DE 25 36 263 A1 discloses an arrangement for locating parts, aligning masks and determining the correct alignment of masks. To this end, this document discloses the optical detection of the legs of a cross-shaped alignment mark for determining the position of a part having the alignment mark, wherein the center of a cross-shaped alignment mark and thus the position of the part can be calculated on the basis of the scanning signals. Moreover, said document discloses the arrangement of reference marks on separate locations on two parts whose mutual positions should be determined. Finally, also the measurement of the mutual positions of two overlapping alignment marks having the shape of a cross is shown.

U.S. Pat. No. 5,086,477 A shows an image processing means for analyzing integrated circuits by means of which also reference marks can be recognized.

It is an object of the present invention to provide a method for determining the position of a defined reference point (ORIGIN) of an alignment mark, which overcomes the disadvantages of the known method. Moreover, it is an object of the present invention to provide an automated method for determining the center of rotationally symmetrical alignment marks, which can be used for aligning at least two flat substrates with respect to each other, in particular a mask and a wafer in a mask aligner.

These objects are achieved with the features of the claims.

In achieving this object, the invention starts out from the basic idea to use rotationally symmetrical alignment marks and to determine their rotational center or central point as the reference point (ORIGIN) by means of image recognition.

To this end, an image of the alignment mark is searched not only once but several times and in different alignments. Typical alignment marks, such as alignment crosses, have the property of being rotationally symmetrical. This property is used in the method of the present invention. For example, an alignment cross is rotationally symmetrical with respect to a quarter rotation, i.e. 90° and all multiples of 90°, i.e. 180°, 270° and 360°. An alignment cross is conserved in case of a rotation around these angles.

According to the method of the present invention, first an image recognition software is trained, for example by determining a preferably rectangular image portion containing the alignment mark to be recognized. Within this image portion, a reference point is defined which represents a first, very rough approximation of the position of the alignment mark to be determined. The image recognition software thus searches the trained alignment mark in a digital image available to it. This image can be the original image which was used for training or a new image in which the center of an alignment mark has to be determined. In contrast to the known method, the reference point does not necessarily have to lie as close as possible to the center of the alignment mark but can be set on any desired position within or also outside the image portion. Preferably, a reference point is selected which lies close to the edge of the image portion.

Subsequently, the image of the alignment mark is rotated by a symmetry angle with respect to which the alignment mark is rotationally symmetrical. The image of the alignment mark can, for example, be rotated in that the image portion which contains the alignment mark to be recognized is supplied to the image recognition software in a manner being rotated by the respective symmetry angle. Furthermore, the image recognition software can search the alignment mark directly in an angle of view being rotated by a specific angle, for example by rotating a search mask, which is placed over the image portion to be tested for searching the alignment mark, by the desired angle and searching the alignment mark within this rotated search mask. Thus, the image recognition software is allowed to search the trained alignment mark not only in the original orientation (angle of rotation of 0°) but also in an angle of the rotational symmetry and to determine a second reference point in this rotated state. In case of the alignment cross, which, comprises a four-fold rotational symmetry, this angle can, for example, be ±90° or ±180°. The rotated image of the alignment mark is then recognized by the image recognition software, and the position of the reference point with respect to the rotated image of the alignment mark is determined. Then, the rotational center and thus the central point of the alignment mark is determined by trigonometric analysis on the basis of the rotated first reference point and the second reference point. This rotational center corresponds to the central point of the alignment mark. If the angle of 180° is selected as the symmetry angle, the determination of the rotational center corresponds to the determination of the central point of the connection line between the rotated first and second reference points.

Once the central point (or ORIGIN) has been determined for a specific alignment mark in accordance with the method of the present invention, the image recognition software represents the position of the alignment mark on the basis of the once determined central point upon recognition of this alignment mark on the same substrate or upon recognition of identical alignment marks on further substrates. The central point can thus be determined both during training and also when again recognizing identical alignment marks on different substrates. The accuracy can be increased by repeating the method of the present invention several times. The center determined for an alignment mark in accordance with the method of the present invention can thus also be used as the new ORIGIN for positioning further substrates with the same alignment marks.

According to the method of the present invention for aligning two flat substrates, which both have a rotationally symmetrical alignment mark and are arranged substantially parallel with respect to each other, the centers of the alignment marks of the two substrates are each determined by using the method for determining the center according to the present invention, and the two substrates are subsequently aligned by shifting at least one of the two substrates in parallel in such a manner that the positions of the centers of the alignment marks coincide.

The method for determining the center according to the present invention is, however, not restricted to a mask aligner, but it can be used in any case in which rotationally symmetrical alignment marks have to be positioned with respect to each other. While in known methods the center of the alignment mask can be determined manually only with a pixel resolution, the image recognition software uses a sub-pixel resolution. By means of the method for determining the center according to the present invention, this high accuracy of the image recognition software can be used for aligning two or more substrates.

Figure 2:
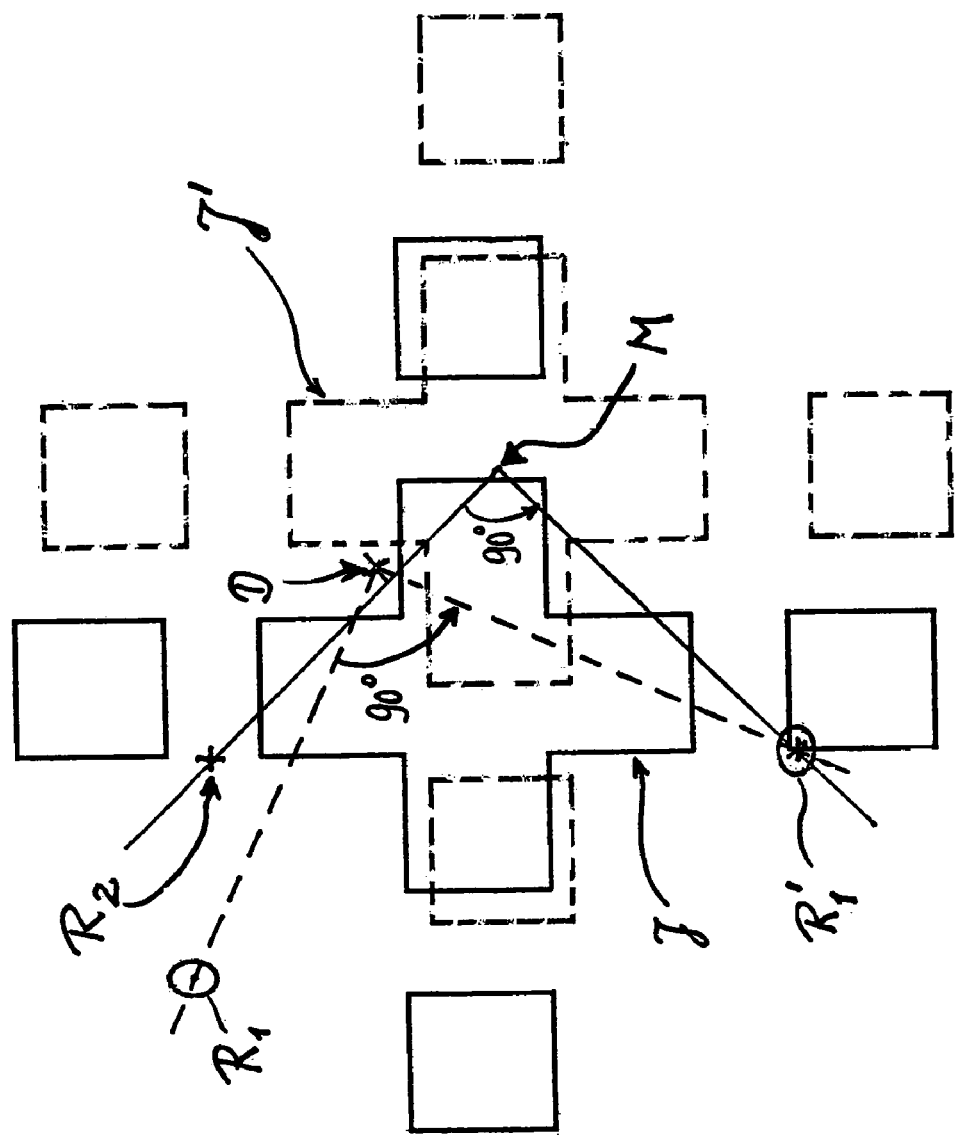

In the following, the invention will be described in more detail with reference to the drawings in which FIG. 1 schematically shows the method of the present invention with a rotation by 180° and FIG. 2 schematically shows the method of the present invention with a rotation by −90°.

In FIGS. 1 and 2, a typical alignment mark J is shown in full lines and configured as an alignment cross. The image recognition software is trained such that it recognizes this alignment cross J. The image recognition system first recognizes on the substrate the alignment cross J in the original orientation (angle of rotation of 0°). After determining a first reference point $R_1$ in the area of the alignment mark J, the image of the alignment mark J with the first reference point $R_1$ is rotated about a point of rotation D by an angle of rotation which corresponds to a symmetry angle with respect to which the alignment mark is rotationally symmetrical, so that the image recognition system receives a rotated image J' of the alignment mark J with the also (co)rotated image $R'_1$ of the first reference point $R_1$. The position of the thus rotated image J' (dashed in FIGS. 1 and 2) of the alignment cross J is then recognized by the image recognition software, and a second reference point $R_2$ for the rotated image J' is determined in accordance with the position of the first reference point $R_1$. The position of the second reference point $R_2$ with respect to the rotated image J' of the alignment mark corresponds to the position of the first reference point $R_1$ with respect to the non-rotated image J of the alignment mark. In the case shown in FIG. 1, the angle of rotation is 180°, in FIG. 2 the angle of rotation is −90°.

The position of the rotated, first reference point $R'_1$ is indicated. Since in FIG. 1 180° was selected as the angle of rotation, the rotational center of the rotationally symmetrical alignment mark can be detected by determining the center M of the connection line between the two reference points $R'_1$ and $R_2$.

This rotational center is the searched center (ORIGIN) of the rotationally symmetrical alignment mark.

In case of the rotation by −90° around a point of rotation D as shown in FIG. 2, the first reference point $R_1$ is transferred into the first reference point $R'_1$ rotated by −90°, and the image J' of the alignment mark, which is rotated by −90° and shown in dashed lines, is supplemented by the reference point $R_2$ corresponding to the first reference point $R_1$. On the basis of these two reference points $R'_1$ and $R_2$, the center of rotation of the image J' of the rotationally symmetrical alignment mark, which is rotated by −90° and shown in dashed lines, is determined as the center M, wherein M, $R'_1$ and $R_2$ are the corners of an isosceles right-angled triangle having its right angle at the searched center M of the rotated image J' of the alignment mark.

In an embodiment of the invention, a plurality of reference points are determined in images being rotated by different angles of rotation, i.e. with a rotation by 90°, 180° and 270°.

Thus, the center of rotation can be determined on the basis of a plurality of reference points; this increases the accuracy of the method.

By means of the center determination according to the present invention it is moreover possible to further automate the training of the alignment marks. To this end, the alignment microscopes first focus with a small magnification a place of the mask at which the alignment marks are located. Typically, pairs of alignment marks are used on masks or wafers, wherein said pairs of alignment marks are arranged at symmetrical positions with respect to the center of the wafer and monitored simultaneously during the alignment process. If there are no data as regards the alignment marks on the substrate, the search should start on the center axis of the mask. The alignment microscopes then preferably move from the center of the mask to the outside on meandering paths. On the images thus made by means of the video microscopes, alignment marks are searched by means of an image recognition software, e.g. Cognex software, by comparing found structures with alignment marks from a database. To this end, the scale and/or size of the alignment marks should first be free. If alignment marks are found, they are tested for their plausibility. For example, it can thus be tested whether the alignment marks have the same distance from the center of the mask or whether the alignment marks found on a mask coincide with respect to their size or angle of rotation, etc. If a pair of alignment marks is selected on the basis of the above-mentioned criteria, the alignment microscopes are positioned above the alignment marks, and the microscope is changed to a larger magnification, if necessary. The microscopes can then be readjusted and the plausibility can be tested again.

Since the alignment marks can have different sizes, the size of an alignment mark as compared to a standard mark is described by a scaling factor. On the basis of this scaling factor, the size of the image portion is calculated and placed around the alignment mark. The reference point is placed within or outside the image portion, and the method for determining the center of the alignment mark according to the present invention is performed.

The invention claimed is:

1. A method for determining the center of a rotationally symmetrical alignment mark thereby using an image recognition software, comprising the following steps:
   (a) recognizing the alignment mark (J) by means of the image recognition software and determining the position of a first reference point ($R_1$) in the area of the alignment mark (J);
   (b) rotating the image (J) of the alignment mark around a symmetry angle with respect to which the alignment mark is rotationally symmetrical;
   (c) recognizing the rotated image (J') of the alignment mark by means of the image recognition software and determining the position of a second reference point ($R_2$) in the rotated image (J') of the alignment mark whose position with respect to the rotated image (J') of the alignment mark corresponds to the position of the first reference point ($R_1$) with respect to the non-rotated image (J) of the alignment mark;
   (d) determining the center of rotation of the rotated image (J') of the alignment mark on the basis of the rotated first reference point ($R_1'$) and the second reference point ($R2$); and
   wherein steps (a)-(d) above are performed by a computer.

2. The method according to claim 1, wherein prior to step (d) the steps (b) and (c) are repeated.

3. The method according to claim 1, wherein prior to step (d) the steps (b) and (c) are repeated until the alignment of the rotated image of the alignment mark corresponds to the original alignment of the alignment mark in step (a).

4. The method according to claim 1, wherein prior to step (a) the image recognition software is trained on the alignment mark to be recognized.

5. The method according to claim 4, wherein the image recognition software is trained by determining an image portion around the alignment mark to be recognized.

6. The method according to claim 5, wherein the alignment mark lies substantially completely in the image portion.

7. The method according to claim 5, wherein the reference point is defined within or outside the image portion close to the edge of the image portion.

8. The method according to claim 1, wherein the alignment mark comprises an alignment cross.

9. The method according to claim 1, wherein the alignment mark has an even-numbered rotational symmetry.

10. The method according to claim 9, wherein the alignment mark is rotated by 180° in step (b).

11. The method according to claim 4, wherein training of the image recognition software comprises the steps of: (a) focusing an alignment microscope to monitor a portion of the substrate within which an alignment mark is located, (b) searching the alignment mark in an image of the monitored portion by comparing structures found in the image of the monitored portion with alignment marks from a database, and (c) testing the plausibility of the found structures to determine whether the alignment mark has been found.

12. The method according to claim 11, wherein the portion of the substrate within which an alignment mark is located is determined by moving the alignment microscope over the surface of the substrate.

13. The method according to claim 12, wherein the alignment microscope is moved from the center of the substrate to the outside on meandering paths.

14. The method according to claim 11, wherein the plausibility is tested in that it is tested whether alignment marks are found on symmetrical positions on the substrate and/or whether alignment marks found on a substrate coincide with respect to their sizes and/or their rotational angles.

15. The method according to claim 11, wherein the alignment microscope is changed to a higher magnification after training of the image recognition software.

16. The method according to claim 15, wherein the plausibility of the found alignment mark is again checked after changing the alignment microscope to a higher magnification.

17. The method according to claim 11, wherein a size of the found alignment mark as compared to a standard mark is described by means of a scaling factor.

18. The method according to claim 17, wherein a size of the image portion used for determining a center is calculated on the basis of the scaling factor.

19. A method for aligning two or more flat substrates being arranged substantially parallel with respect to each other, wherein each of the two or more substrates has a rotationally symmetrical alignment mark, comprising the following steps:
   (a) determining the center (M) of the alignment mark of a first one of the two or more substrates by means of the method according to claim 1, (b) determining the center (M) of the alignment mark of a second one of the two or more substrates by means of the method according to claim 1, (c) aligning the first and the second substrates with respect to each other by movement, preferably parallel movement of at least one of the first and the second substrates in such a manner that the positions of the centers of the two alignment marks determined in Steps (a) and (b) coincide; and wherein steps (a)-(c) are performed by a computer.

20. The method according to claim 19, wherein one of the substrates is a mask and the other substrates are wafers.

21. The method according to claim 19, wherein the substrates are wafers.

22. The method according to claim 19, wherein the outer geometry of the alignment mark of one of the substrates is not covered by the alignment mark of the other substrates.

* * * * *

UNITED STATES PATENT AND TRADEMARK OFFICE
CERTIFICATE OF CORRECTION

| | | |
|---|---|---|
| PATENT NO. | : 7,567,699 B2 | Page 1 of 1 |
| APPLICATION NO. | : 11/176961 | |
| DATED | : July 28, 2009 | |
| INVENTOR(S) | : Sven Hansen | |

It is certified that error appears in the above-identified patent and that said Letters Patent is hereby corrected as shown below:

Title Page, Item (73) Assignee: replace "Sus" with --Suss--

Signed and Sealed this
Twenty-third Day of August, 2011

David J. Kappos
*Director of the United States Patent and Trademark Office*